United States Patent
Yamaji

(10) Patent No.: US 8,368,141 B2
(45) Date of Patent: Feb. 5, 2013

(54) HIGH BREAKDOWN VOLTAGE SEMICONDUCTOR DEVICE AND HIGH VOLTAGE INTEGRATED CIRCUIT

(75) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 189 days.

(21) Appl. No.: 12/719,541

(22) Filed: Mar. 8, 2010

(65) Prior Publication Data

US 2010/0264491 A1   Oct. 21, 2010

(30) Foreign Application Priority Data

Apr. 8, 2009   (JP) .................................. 2009-093513

(51) Int. Cl.
   *H01L 29/66* (2006.01)
(52) U.S. Cl. ................. 257/339; 257/341; 257/E29.261
(58) Field of Classification Search .................. 257/343, 257/341, 339, 328, 487, 355, 356, 367
   See application file for complete search history.

(56) References Cited

U.S. PATENT DOCUMENTS

| 6,452,231 B1 * | 9/2002 | Nakagawa et al. ........... 257/343 |
| 2004/0119132 A1 | 6/2004 | Akiyama et al. |
| 2006/0249807 A1 | 11/2006 | Akiyama |

FOREIGN PATENT DOCUMENTS

| JP | 3489362 B2 | 1/2004 |
| JP | 2006-313828 A | 11/2006 |
| JP | 4020195 B2 | 12/2007 |

* cited by examiner

*Primary Examiner* — Chuong A Luu
*Assistant Examiner* — Nga Doan
(74) *Attorney, Agent, or Firm* — Rossi, Kimms & McDowell LLP

(57) ABSTRACT

A high breakdown voltage semiconductor device, in which a semiconductor layer is formed on a semiconductor substrate across a dielectric layer, includes a drain layer on the semiconductor layer, a buffer layer formed so as to envelop the drain layer, a source layer, separated from the drain layer, and formed so as to surround a periphery thereof, a well layer formed so as to envelop the source layer, and a gate electrode formed across a gate insulating film on the semiconductor layer, wherein the planar shape of the drain layer 113 and buffer layer is a non-continuous or continuous ring.

10 Claims, 15 Drawing Sheets

HIGH BREAKDOWN VOLTAGE SEMICONDUCTOR DEVICE AND HIGH VOLTAGE INTEGRATED CIRCUIT

BACKGROUND

The present invention relates to a high breakdown voltage semiconductor device using a silicon on insulator (SOI) substrate, and in particular, has an object of being used in a power conversion integrated circuit represented by a high voltage integrated circuit (HVIC). It may mainly be utilized in a lateral double diffused MOSFET (LDMOSFET) of a 100 volt to 1200 volt high breakdown voltage class.

In recent years, accompanying a demand for a high breakdown voltage of a power IC, an SOI substrate which can completely isolate elements using trench dielectric isolation and an insulating film has attracted attention. By forming a high voltage power conversion integrated circuit on the SOI substrate, advantages include preventing a malfunction due to a parasitic element when switching, preventing interference due to noise, a reduction of parasitic capacity, and the like. Also, as it is possible to apply trench dielectric isolation to an edge structure or high voltage junction termination (HVJT) structure of each device in the integrated circuit, an advantage of a chip size shrink of the integrated circuit itself can also be expected.

FIG. 12 is a sectional view of a main portion of a heretofore known high breakdown voltage semiconductor device. The heretofore known high breakdown voltage semiconductor device 950 shown in FIG. 12 is such that, a dielectric layer 901 being provided on the upper surface of a support substrate 900, an n⁻ type semiconductor layer 902, which is formed of a semiconductor substrate, is included on the upper surface of the dielectric layer 901. The dielectric layer 901 dielectrically isolates the support substrate 900 and n⁻ type semiconductor layer 902, and insulating isolation in a horizontal direction inside the n⁻ type semiconductor layer 902 is compartmentalized by trench dielectric isolation with a silicon dioxide film 904 packed into a trench 903 formed in the n⁻ type semiconductor layer 902. Within a predetermined range in the compartmentalized n⁻ type semiconductor layer 902, taking the n⁻ type semiconductor layer 902 to be a drain-drift region 902, a high concentration drain n⁺ layer 913, and an n-type buffer layer 912 with a resistance higher than that of the drain n⁺ layer 913, are included in a central portion of the upper surface of the drain-drift region 902, and a p-type well diffusion layer 911, and a source n⁺ layer 914 inside the p-type well diffusion layer 911, are each formed so as to be separated from the n-type buffer layer 912, and to encircle the n-type buffer layer 912. Also, there being provided the source n⁺ layer 914 and p-type well diffusion layer 911, and a gate electrode 910 on the drain-drift region 902 across an insulating film, a source electrode 908 and drain electrode 909 are provided on the source n⁺ layer 914 and drain n⁺ layer 915 respectively, and the source electrode 908 and drain electrode 909 are mutually insulated by a field oxide film 905, an interlayer insulating film (ILD: Inter Layer Dielectrics) 906, and passivation film 907. Also, field plate electrodes are provided on the source n⁺ layer 914 and drain n⁺ layer 913, jutting toward each other above the drain-drift region 902. In FIG. 12, the source electrode 908 and drain electrode 909 configure the field plate electrodes by extending on the interlayer insulating film 906.

On fixing the support substrate 900, source electrode 908, and gate electrode 910 at a ground potential, and applying a positive bias to the drain electrode 909, a depletion layer extends from the p-n junction between the p-type well diffusion layer 911 and n⁻ type semiconductor layer 902 of the semiconductor device 900. Also, as the support substrate 900 is fixed at the ground potential at the same time, a depletion layer also extends from the interface of the dielectric layer 901 and n⁻ type semiconductor layer 902. Therefore, depletion layers extend from the horizontal direction and vertical direction inside the n⁻ type semiconductor layer 902, and the surface electric field of the drain-drift region 902 is reduced. This advantage is generally called a RESURF (RESURF: Reduced Surface Field) effect.

By making a distance Ld between the n-type buffer layer 912 and p-type well diffusion layer 911 of the drain-drift region 902 sufficiently long, adjusting to an optimum impurity concentration, and optimizing the length by which the field plate electrodes jut out, the design is such that the surface electric field is reduced, there is no electric field concentration at the p-n junction, and also, no avalanche breakdown occurs on the semiconductor substrate surface, even when a high voltage is applied to the drain electrode 909.

At this time, the avalanche breakdown occurs at the interface of the drain-drift region 902 and dielectric layer 901. A breakdown voltage Vbr of this kind of high breakdown voltage semiconductor device when satisfying the RESURF conditions is expressed, converting a Poisson equation, as Expression 1.

Expression 1

$$Vbr = Ecr*(d/2 + Tox* \in si / \in ox) \qquad (1)$$

Herein, Ecr is a critical electric field, d is the thickness of the n⁻ type semiconductor layer 902 (unit: μm), and Tox is the thickness of the dielectric layer 901 (unit: μm). Herein, in a case in which the n⁻ type semiconductor layer 902 is formed of silicon, and the dielectric layer 901 of a silicon dioxide film, the breakdown voltage Vbr is such that, when substituting Ecr=3E5 (V/cm), d=20 μm, Tox=5 μm, ∈si=11.7, and ∈ox=3.9, Vbr=750V.

Generally, in a case in which the breakdown voltage of a level shifter and high breakdown voltage bootstrap diode mounted in an HVIC has a product specification of 600 volts, taking into consideration a resistivity fluctuation of the n⁻ type semiconductor layer 902, a fluctuation in thickness of the dielectric layer 901, and furthermore, the actual breakdown voltage of a power MOSFET, and the like, controlled by the HVIC, a breakdown voltage in the range of at least 750V is required.

According to Expression 1, in order to increase the breakdown voltage of the high breakdown voltage semiconductor device, it is sufficient to carry out an increase of the thickness d of the n⁻ type semiconductor layer 902, or of the thickness Tox of the dielectric layer 901, but with regard to the thickness d of the n⁻ type semiconductor layer 902, as there are restrictions in manufacturing processes such as an etching of the trench which compartmentalizes the elements in a horizontal direction on the n⁻ type semiconductor layer 902, and an oxide film embedding, a range of d=10 to 20 μm is a realistic value. Also, there is a problem in that, in the case of an SOI substrate using a layer bonding method, the greater the thickness Tox of the dielectric layer 901, the greater the wafer warpage in the IC processing manufacturing process, and a problem in that, as there is an accompanying increase in the deposition time of the dielectric layer 901 in a high temperature oven, the cost of the SOI substrate increases. In addition, as increasing the thickness of the dielectric layer 901 reduces the extension of the depletion layer extending from the junction surface of the dielectric layer 901 and n⁻ type semiconductor layer 902, the RESURF effect decreases, and the high breakdown voltage semiconductor device surface electric field becomes steep, meaning that the breakdown voltage decreases. Therefore, even when estimating on the thick side, a range of Tox=4 to 5 μm is a realistic value for the thickness of the dielectric layer 901.

However, when attempting to integrate the high breakdown voltage semiconductor device 900, including the thick dielectric layer 901 and thick n⁻ type semiconductor layer 902 optimized for a high breakdown voltage application in this way, in one chip in order to mount it in a power conversion integrated circuit such as the HVIC, it is necessary to connect it from the drain electrode 909, with an aluminum wire 917 or the like, to an unshown high voltage region, which is a high side drive circuit. When attempting to carry out this connection by passing the wire from the central electrode (the drain electrode 909) of the high breakdown voltage semiconductor device over the peripheral semiconductor region (the source n⁺ layer 914 and p-type well diffusion layer 911), as described in Japanese Patent No. 3489362, the potential of the drain-drift region 902 is drawn to the potential of the drain electrode 909, and an electric field concentrates locally in the vicinity of the p-type well diffusion layer 911, meaning that there is a problem in that, not only does a uniform breakdown voltage design fall apart, but also the region below the wire is of a low voltage, an avalanche breakdown occurs, and the breakdown voltage decreases.

Therein, normally, in order to carry out a stable high potential wiring from a semiconductor device formed in a dielectrically isolated region to an adjacent or separate dielectrically isolated region, the kind of high potential wiring connection method using a bonding wire shown in JP-A-2006-313828 and Japanese Patent No. 4020195 is implemented. In JP-A-2006-313828 and Japanese Patent No. 4020195, a method is proposed wherein a separate dielectric body is disposed adjacent to the dielectric layer in a lamination direction, and the breakdown voltage of the semiconductor device is kept high. However, the configurations described in JP-A-2006-313828 and Japanese Patent No. 4020195 involve a complicated rear surface processing process which increases costs.

SUMMARY OF THE INVENTION

The invention, bearing in mind the heretofore described points, provides a high breakdown voltage semiconductor device and high voltage integrated circuit device which can realize an increase in breakdown voltage and an increase in reliability, at a low cost, for a wire connected high breakdown voltage semiconductor device, involving absolutely no complicated processing manufacturing process or complicated rear surface processing process.

In order to solve the heretofore described problems, a high breakdown voltage semiconductor device according to one aspect of the invention, in which a support substrate and a first conductive type semiconductor layer on the support substrate across a dielectric layer are formed, includes a first conductive type drain layer, with an impurity concentration higher than that of the semiconductor layer, on the semiconductor layer; a first conductive type buffer layer, formed so as to envelop the drain layer, and with an impurity concentration between those of the semiconductor layer and drain layer; a first conductive type source layer with an impurity concentration higher than that of the semiconductor layer, separated from the drain layer, and formed so as to surround a periphery thereof; a second conductive type well layer formed so as to envelop the source layer; a gate electrode formed on the source layer, a well layer, and the semiconductor layer interposed between the well layer and buffer layer, across a gate insulating film; a drain electrode electrically connected to the drain layer; and a source electrode electrically connected to the source layer, wherein the planar shape of the drain layer and buffer layer is a non-continuous or continuous ring.

Also, a high breakdown voltage semiconductor device according to a second aspect of the invention, in which a support substrate and a first conductive type semiconductor layer on the support substrate across a dielectric layer are formed, includes a first conductive type drain layer, with an impurity concentration higher than that of the semiconductor layer, on the semiconductor layer; a first conductive type buffer layer, formed so as to envelop the drain layer, and with an impurity concentration between those of the semiconductor layer and drain layer; a first conductive type source layer with an impurity concentration higher than that of the semiconductor layer, separated from the drain layer, and formed so as to surround a periphery thereof; a second conductive type well layer formed so as to envelop the source layer; a gate electrode formed on the source layer, a well layer, and the semiconductor layer interposed between the well layer and buffer layer, across a gate insulating film; a drain electrode electrically connected to the drain layer; and a source electrode electrically connected to the source layer, wherein, the planar shape of the drain layer being a non-continuous or continuous ring, the high breakdown voltage semiconductor device includes a second conductive type diffusion layer formed on the interior side of the ring at a depth from the surface of the semiconductor layer greater than that of the buffer layer.

Also, according to a third aspect of the invention, the high breakdown voltage semiconductor device according to the first or second aspect includes a drain pad electrically connected to the drain electrode, across an insulating film, on the semiconductor layer on the interior side of the drain layer, and has a bonding wire connected to the drain pad.

Also, a high voltage integrated circuit device according to a fourth aspect of the invention includes the high breakdown voltage semiconductor device according to the third aspect, a high voltage region formed across an isolation region formed in the high breakdown voltage semiconductor device and semiconductor layer, and an electrode pad formed across an insulating film on the semiconductor layer in a high breakdown voltage region, wherein the electrode pad and bonding wire are connected.

Also, a high breakdown voltage semiconductor device according to a fifth aspect of the invention, in which a support substrate and a first conductive type semiconductor layer on the support substrate across a dielectric layer are formed, includes a first conductive type cathode layer, with an impurity concentration higher than that of the semiconductor layer, on the semiconductor layer; a first conductive type buffer layer, formed so as to envelop the cathode layer, and with an impurity concentration between those of the semiconductor layer and cathode layer; and a second conductive type anode layer with an impurity concentration higher than that of the semiconductor layer, separated from the cathode layer, and formed so as to surround a periphery thereof, wherein the planar shape of the cathode layer and buffer layer is a non-continuous or continuous ring.

Also, a high breakdown voltage semiconductor device according to a sixth aspect of the invention, in which a support substrate and a first conductive type semiconductor layer on the support substrate across a dielectric layer are formed, includes a first conductive type cathode layer, with an impurity concentration higher than that of the semiconductor layer, on the semiconductor layer; a first conductive type buffer layer, formed so as to envelop the cathode layer, and with an impurity concentration between those of the semiconductor layer and cathode layer; and a second conductive type anode layer with an impurity concentration higher than that of the semiconductor layer, separated from the cathode layer, and formed so as to surround a periphery thereof, wherein, the planar shape of the cathode layer being a non-continuous or continuous ring, the high breakdown voltage semiconductor device includes a second conductive type diffusion layer formed on the interior side of the ring at a depth from the surface of the semiconductor layer greater than that of the buffer layer.

According to these aspects of the invention, as it is possible to realize it with the same resistivity, the same SOI layer film thickness, and the same embedded dielectric layer film thickness as those of the heretofore known high breakdown voltage semiconductor device, with only a difference in the configuration of the buffer layer of the drain region, it is possible to provide a high breakdown voltage semiconductor device and high voltage integrated circuit device with high breakdown voltage and high reliability, with no increase in manufacturing cost.

BRIEF DESCRIPTION OF THE DRAWINGS

The invention will be described with reference to certain preferred embodiments thereof and the accompanying drawings, wherein.

DETAILED DESCRIPTION OF THE EMBODIMENTS

Normally, when a high voltage is applied to a drain terminal of a high breakdown voltage semiconductor device on an SOI substrate, a depletion layer extends from a pn junction of a second conductive type well layer and first conductive type semiconductor layer corresponding to a drain-drift region, at the same time as which a depletion layer also extends from a junction of an embedded dielectric layer and the first conductive type semiconductor layer, a high electric field presently builds up at a junction of the embedded dielectric layer in contact with the lower portion of a drain electrode and the first conductive type semiconductor layer, a critical electric field is attained, and an avalanche breakdown occurs. However, as heretofore described, as it is possible, by forming a first conductive type high concentration drain layer and a first conductive type buffer layer encircling it in rings on the SOI substrate, to narrow the high electric field region at the junction of the embedded dielectric layer in contact with the lower portion of the drain electrode and the first conductive type semiconductor layer, and also, at the same time, to reduce a surface electric field, it is possible to increase the critical electric field.

As a result thereof, with the high breakdown voltage semiconductor device of the invention, wherein the buffer layer encircling the high concentration drain layer is formed in a ring, it is possible to make breakdown voltage several tens of volts higher than with the heretofore known high breakdown voltage semiconductor device including a buffer layer which fills the lower portion of the drain electrode in a circular form, and uniformly. Also, as it is normally necessary to make the drain-drift region of a low impurity concentration in order to produce a high breakdown voltage of several hundred volts, with a configuration wherein an electric field concentration region concentrates in a region relatively near to a bulk surface (a drain-drift region surface) immediately below the drain electrode, as in the heretofore known structure, a breakdown voltage fluctuation, and the like, has been likely to occur due to a surface charge effect. However, with the structure of the invention, as it is a structure wherein a high electric field builds up in an interface region of the embedded dielectric layer and an $n^-$ type semiconductor layer, and it is difficult for an electric field to concentrate on the bulk surface, it is possible to reduce the effect of a drain-drift region surface charge when a high voltage is applied to the drain terminal.

Embodiment 1

Figure 1:
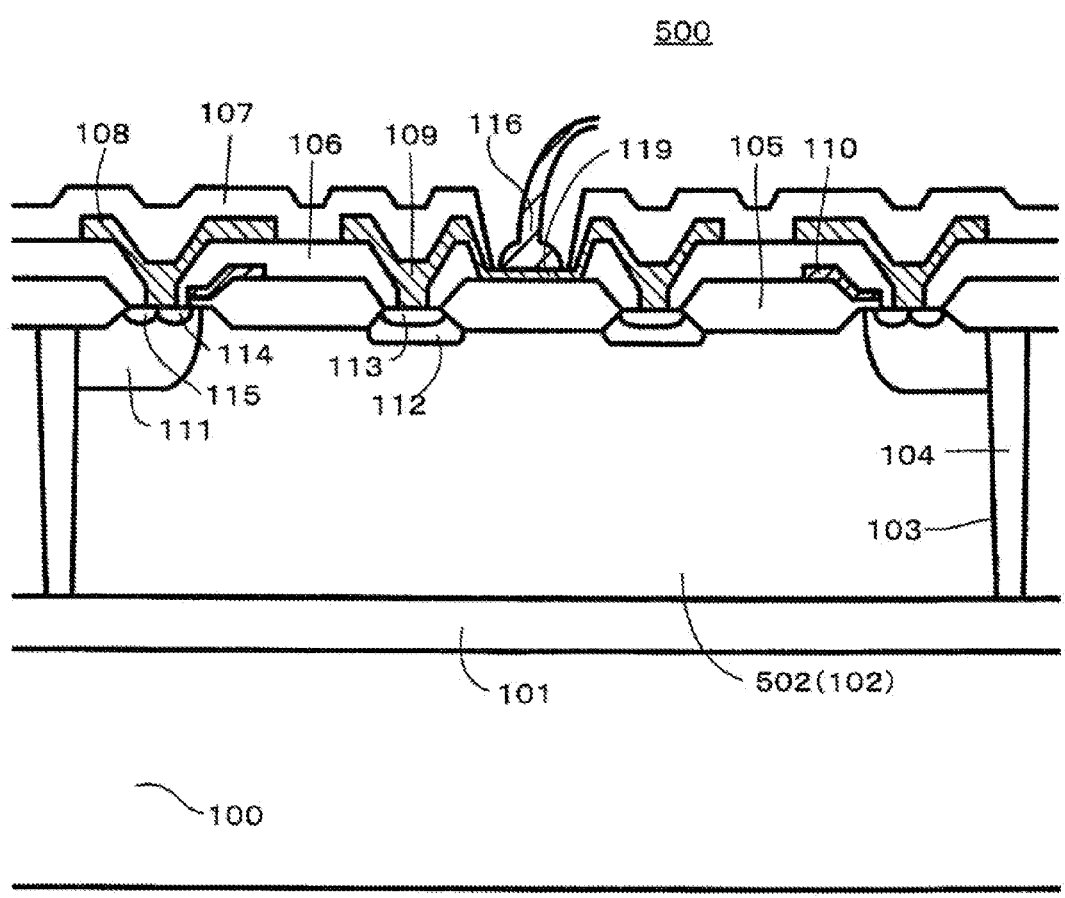
FIG. 1 is a sectional view of a main portion of a high breakdown voltage semiconductor device of one embodiment of the invention.
Figure 2:
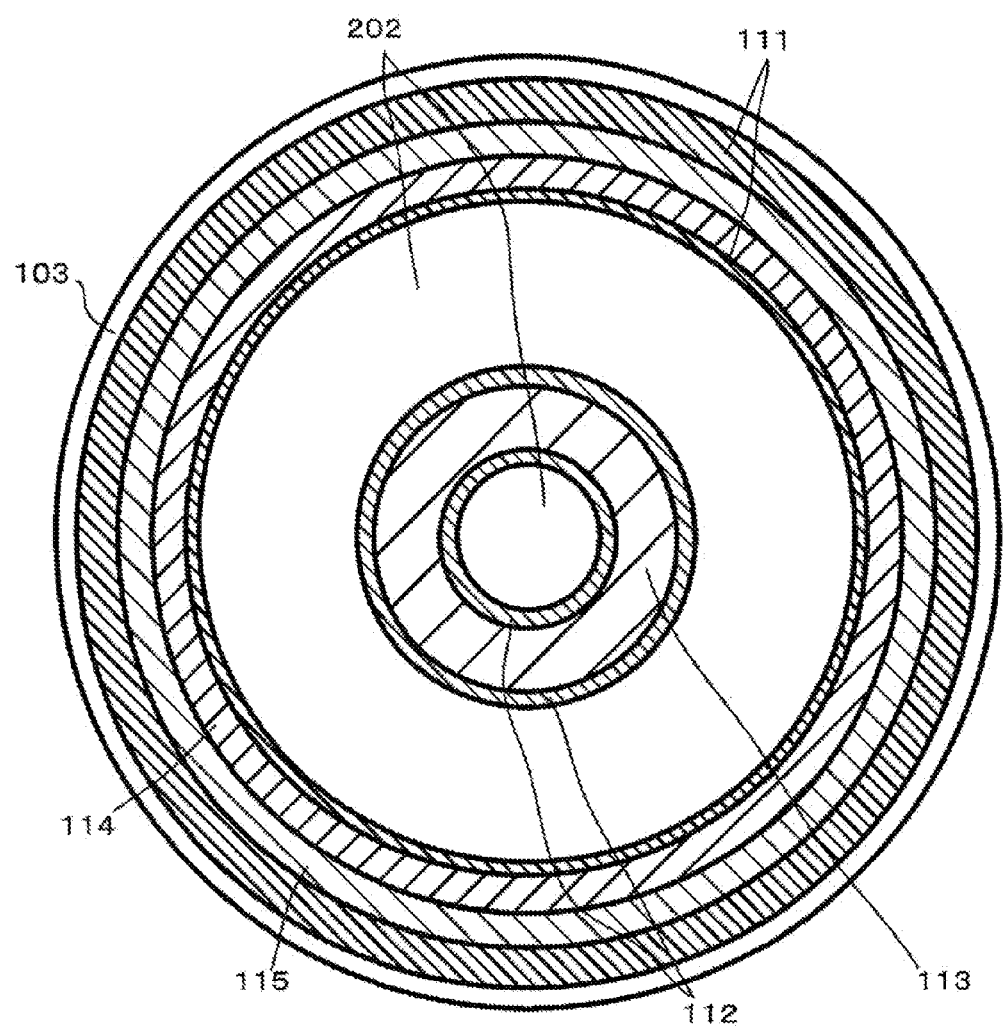
FIG. 2 is a plan view of a main portion of FIG. 1.

FIG. 1 is a sectional view of a main portion of a high breakdown voltage semiconductor device of one embodiment of the invention. FIG. 2, being a plan view of a main portion of FIG. 1, is a plan view in a condition in which no insulating film or electrode is formed on the surface of an $n^-$ type semiconductor layer 102 in FIG. 1.

A high breakdown voltage semiconductor device 500 is such that, a dielectric layer 101 being provided on the upper surface of a support substrate 100, the $n^-$ type semiconductor layer 102, which is formed of a silicon substrate, is included on the upper surface of the dielectric layer 101. The dielectric layer 101 dielectrically isolates the support substrate 100 and $n^-$ type semiconductor layer 102, and insulating isolation in a horizontal direction inside the $n^-$ type semiconductor layer 102 is such that, a trench 103 being formed in the $n^-$ type semiconductor layer 102, the $n^-$ type semiconductor layer 102 is compartmentalized by trench dielectric isolation using a silicon dioxide film 104 packed into the trench 103. Within a predetermined range in the compartmentalized $n^-$ type semiconductor layer 102, taking the $n^-$ type semiconductor layer 102 to be a drain-drift region 502, a high concentration drain $n^+$ layer 113, and an n-type buffer layer 112 with a breakdown voltage higher than that of the drain $n^+$ layer 113, are included in a central portion of the upper surface of the $n^-$ type semiconductor layer 102, and the n-type buffer layer 112 is formed in a ring shape in such a way as to enclose the drain $n^+$ layer 113. Also, a p-type well diffusion layer 111, and a source $n^+$ layer 114 and well pick-up $p^+$ layer 115 inside the p-type well diffusion layer 111, are each formed so as to be separated from the n-type buffer layer 112, and to encircle the drain n+ layer 113. Also, there being provided the source n+ layer 114 and p-type well diffusion layer 111, and a gate electrode 110 made of polysilicon on the drain-drift region 502 across an insulating film, a source electrode 108 and drain electrode 109 are provided on the source n+ layer 114 and drain n+ layer 113 respectively, and the source electrode 108 and drain electrode 109 are mutually insulated by a field oxide film (LOCOS: Local Oxidation of Silicon) 105 and interlayer insulating film 106. Also, field plate electrodes are provided on the source n+ layer 114 and drain n+ layer 113 in such a way as to jut toward each other on the drain-drift region 502 across the interlayer insulating film. In the embodiment, the source electrode 108 and drain electrode 109 also function as the field plate electrodes by extending on the drain-drift region 502. Apart from a drain pad 119, they are covered by a passivation film 107 made of a plasma silicon nitride film.

Also, the film thickness of the dielectric layer 101 is Tox=5.0 μm, and the film thickness of the n− type semiconductor layer 102 is Tsoi=20.0 μm. The trench width of the trench 103 being Lt=1.5 μm, it is formed by overetching to a trench depth of around Dt=22 μm, using dry etching, so that it reaches the dielectric layer 101. A dielectric body, such as a plasma tetra-ethoxy-silane (P-TEOS) oxide film, is embedded inside the trench 103. The p-type well diffusion layer 111 is formed to a diffusion depth of around Xj=3.5 μm by a high temperature thermal oxidation and a high temperature $N_2$ drive-in process. The n-type buffer layer 112 is formed to a diffusion depth of around Xj=1.3 μm by a high temperature $N_2$ drive-in process. Also, the resistivity of the n− type semiconductor layer 102 is 12.5 (Ω/cm), the boron impurity concentration of the p-type well diffusion layer 111 is around 1.5E17 (/cm$^3$), and the phosphorus impurity concentration of the n-type buffer layer 112 is around 1E17 (/cm$^3$). The source n+ layer 114 and drain n+ layer 113 are formed with an arsenic impurity concentration of 1E20 (/cm$^3$), and the well pick-up p+ layer 115 with a $BF_2$ impurity concentration of 1E20 (/cm$^3$). The distance between the n-type buffer layer 112 and p-type well diffusion layer 111 is approximately 100 μm, and the width (diameter) of the drain pad 119, which is for a bonding electrically connected to the drain electrode 109, is around 100 μm.

Furthermore, a high potential wiring from the high breakdown voltage semiconductor device 500 to a high voltage region (a high potential floating region) formed in the same semiconductor substrate is carried out with a bonding wire 116 connected by bonding to the drain pad 119 in a position on the field oxide film 105.

In the embodiment, as shown in FIG. 2, the planar shape of each region of the high breakdown voltage semiconductor device, and of the trench 103, is shown as being circular, but they may also be of an approximately polygonal shape or elliptical shape formed of linear portions and arc portions, rather than circular.

Herein, in the high breakdown voltage semiconductor device 500, on fixing the support substrate 100, source electrode 108, and gate electrode 110 at a ground potential, and applying a positive bias to the drain electrode 109, a depletion layer extends from the pn junction between the p-type well diffusion layer 111 and n− type semiconductor layer 102 of the semiconductor device. Also, as the support substrate 100 is fixed at the ground potential at the same time, a depletion layer also extends from the interface of the dielectric layer 101 and n− type semiconductor layer 102.

Hereafter, a description will be given of results of carrying out simulations. The simulations have been carried out with the structure of the invention depicted in FIG. 1 and, as a reference example, a semiconductor device shown in FIG. 5.

Figure 5:
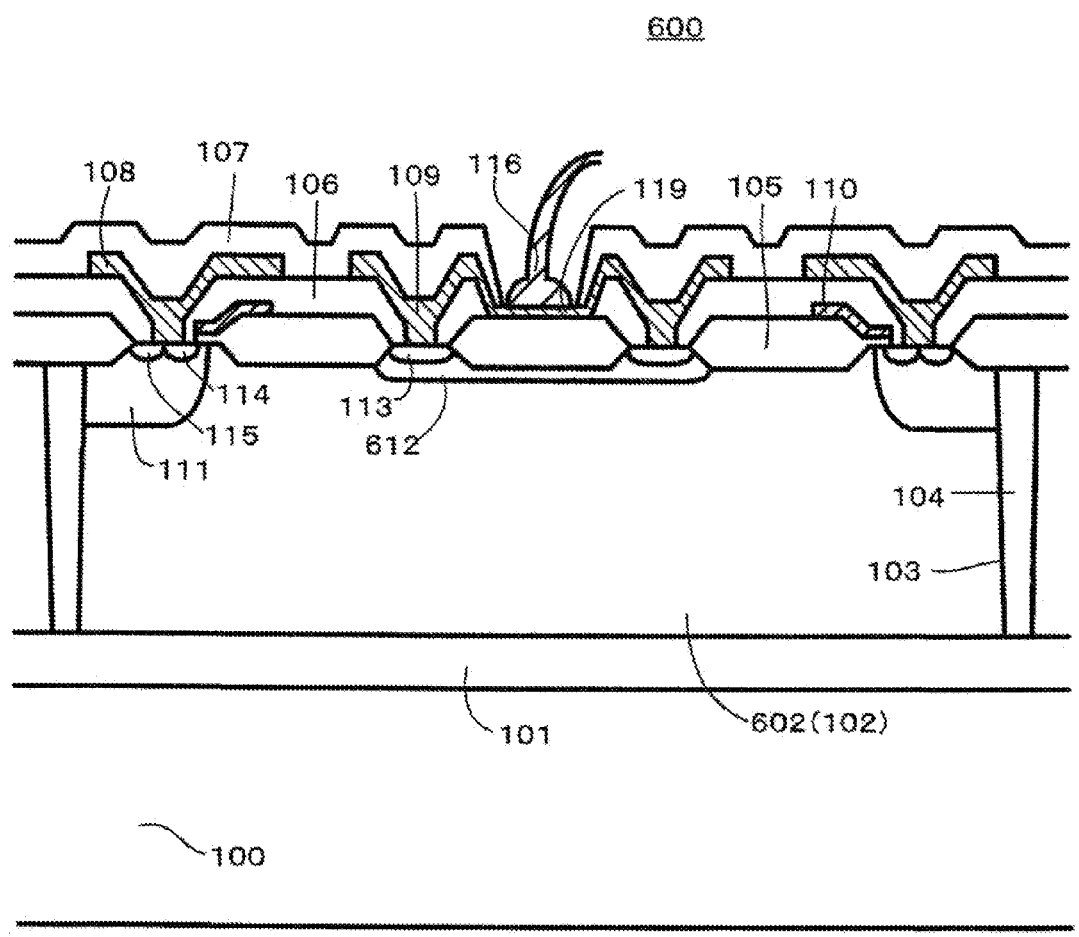
FIG. 5 is a sectional view of a main portion of a high breakdown voltage semiconductor device of a reference example.

FIG. 5 is a sectional view of a main portion of the high breakdown voltage semiconductor device of the reference example. The high breakdown voltage semiconductor device 600 shown in FIG. 5 differs from the configuration of FIG. 1 in that the n-type buffer layer 112 is replaced with an n-type buffer layer 612 whose planar shape is circular. The n-type buffer layer 612 is interposed between the field oxide film 105 and n− type semiconductor layer 102 below the drain pad 119, and is formed in such a way as to cover the field oxide film 105 and drain n+ layer 113.

Figure 3A:
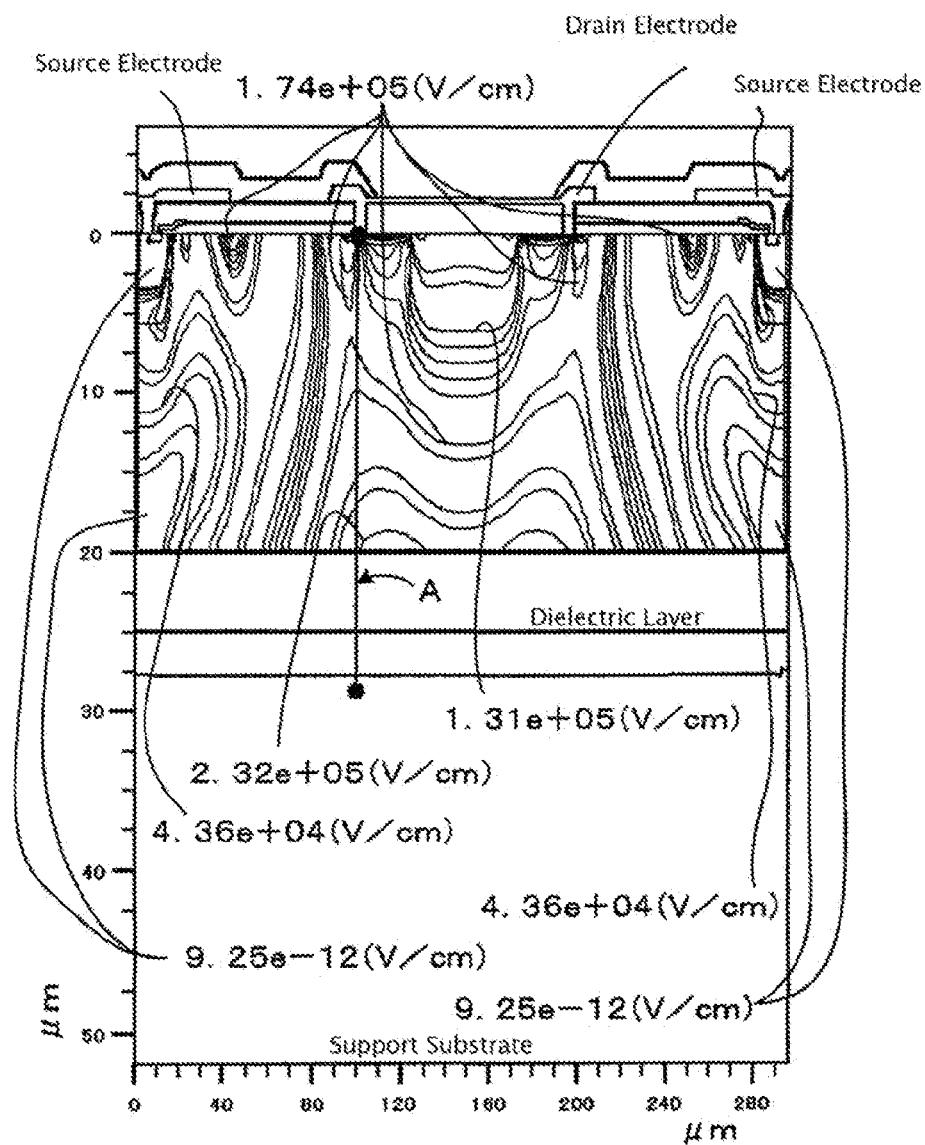
FIGS. 3A and 3B are diagrams showing a device simulation result.
Figure 3B:
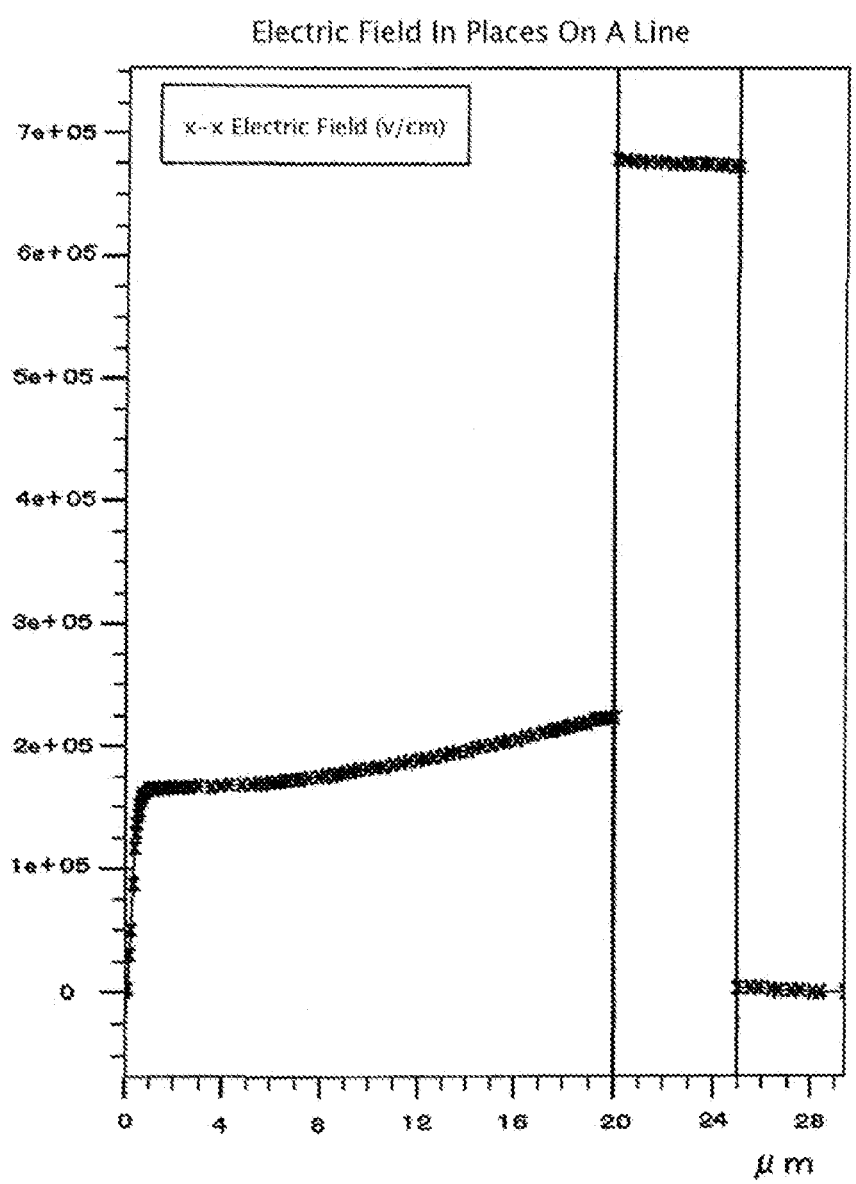
Figure 6A:
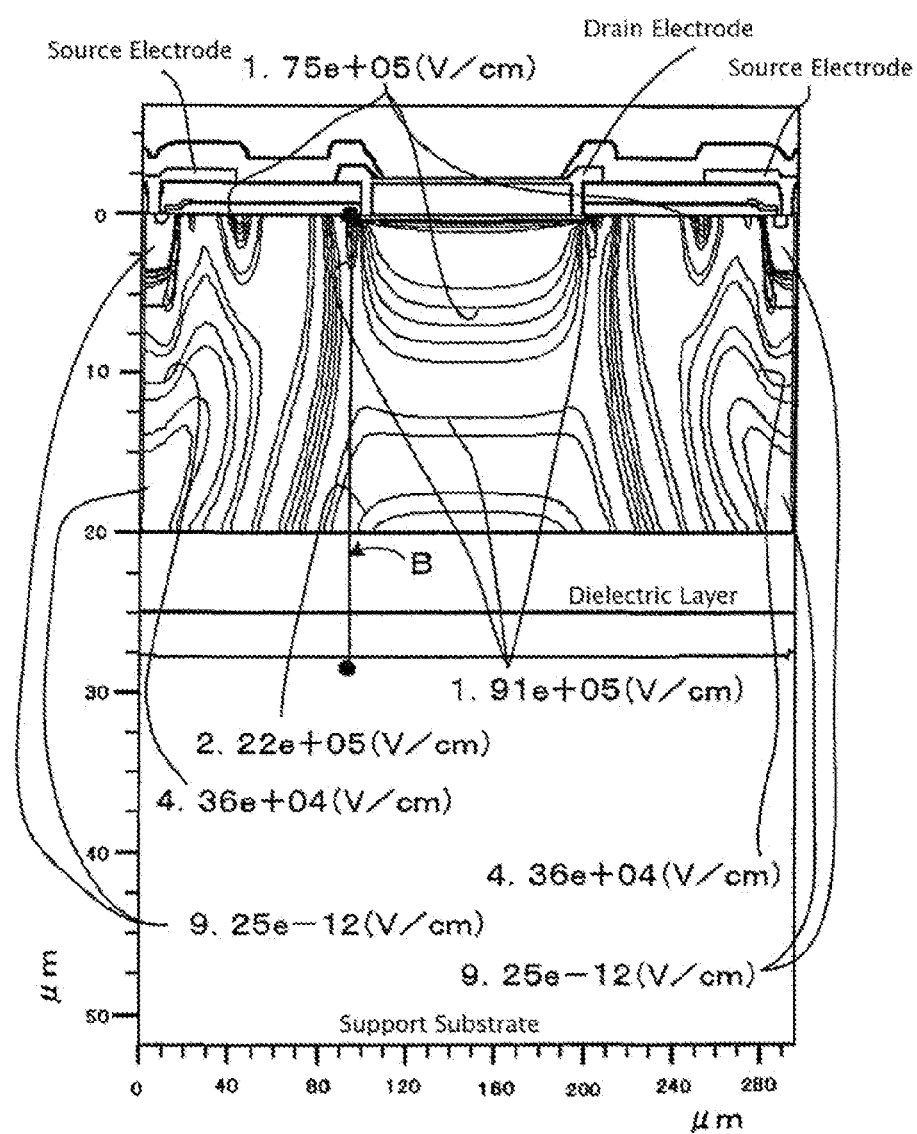
FIGS. 6A and 6B are diagrams showing a device simulation result.
Figure 6B:
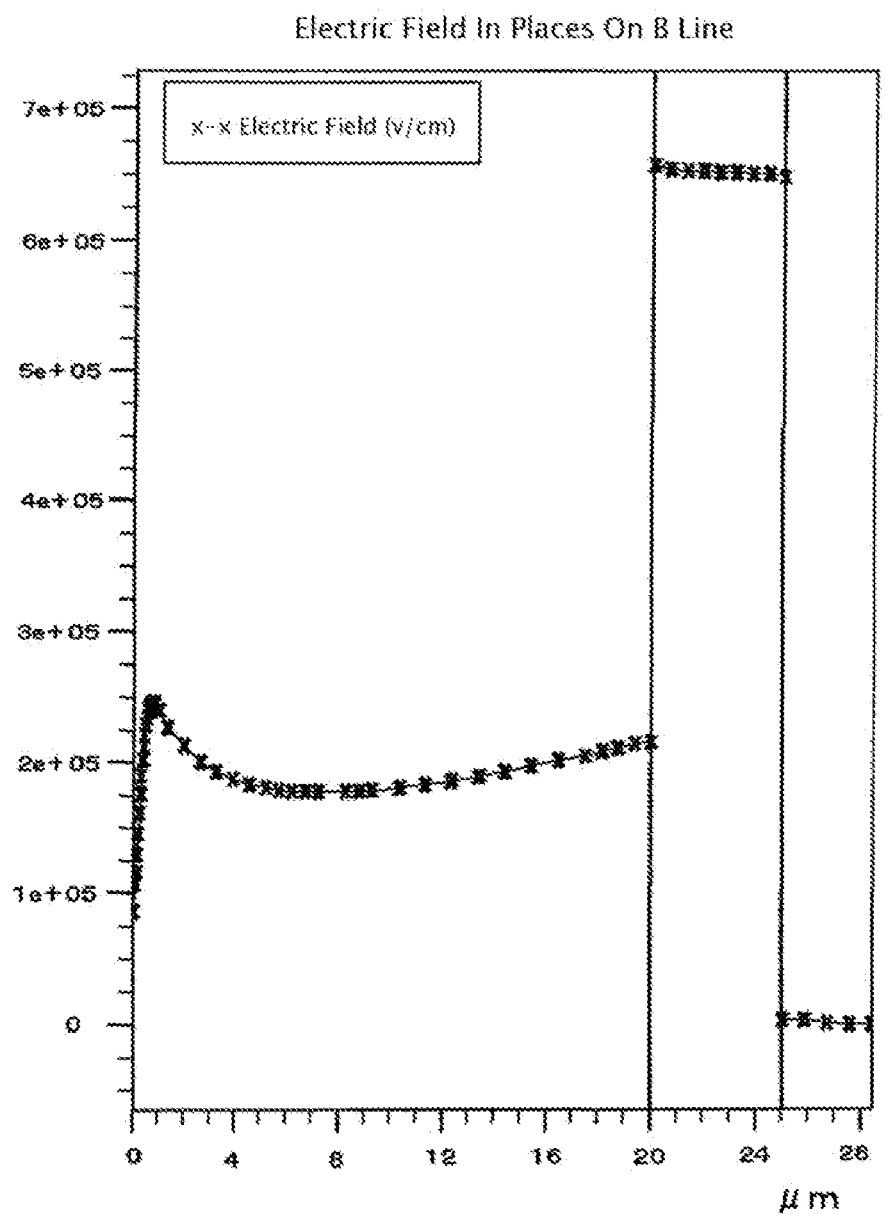

FIGS. 3A, 3B, 6A, and 6B being diagrams showing the device simulation results, FIGS. 3A and 6A show an appearance of a two dimensional electric field distribution when, using a two dimensional device simulation, the support substrate 100, source electrode 108, and gate electrode 110 of the high breakdown voltage semiconductor devices 500 and 600 respectively are fixed at the ground potential, and a voltage of 700 volts is applied to the drain electrode 109, and FIGS. 3B and 6B show a one dimensional electric field intensity waveform cut in a vertical direction so as to pass through an electric field concentration point (the A line in FIGS. 3A and 3B, and the B line in FIGS. 6A and 6B) from the drain n+ layer 113 on the surface of the high breakdown voltage semiconductor devices 500 and 600 to the dielectric layer 101 in FIGS. 3A and 6A.

As opposed to the case of the reference example of FIGS. 6A and 6B, in which a high electric field region concentrates in one peak at the interface of the dielectric layer 101 and n− type semiconductor layer 102, in the case of the invention of FIGS. 3A and 3B, the high electric field region concentrates divided into two peaks. Because of this, with the configuration of the invention in which the n-type buffer layer 112 formed in a ring is disposed, a critical electric field at the interface of the dielectric layer 101 and n− type semiconductor layer 102 increases, and it is possible to maintain the voltage at which a breakdown condition occurs several tens of volts higher.

Figure 4:
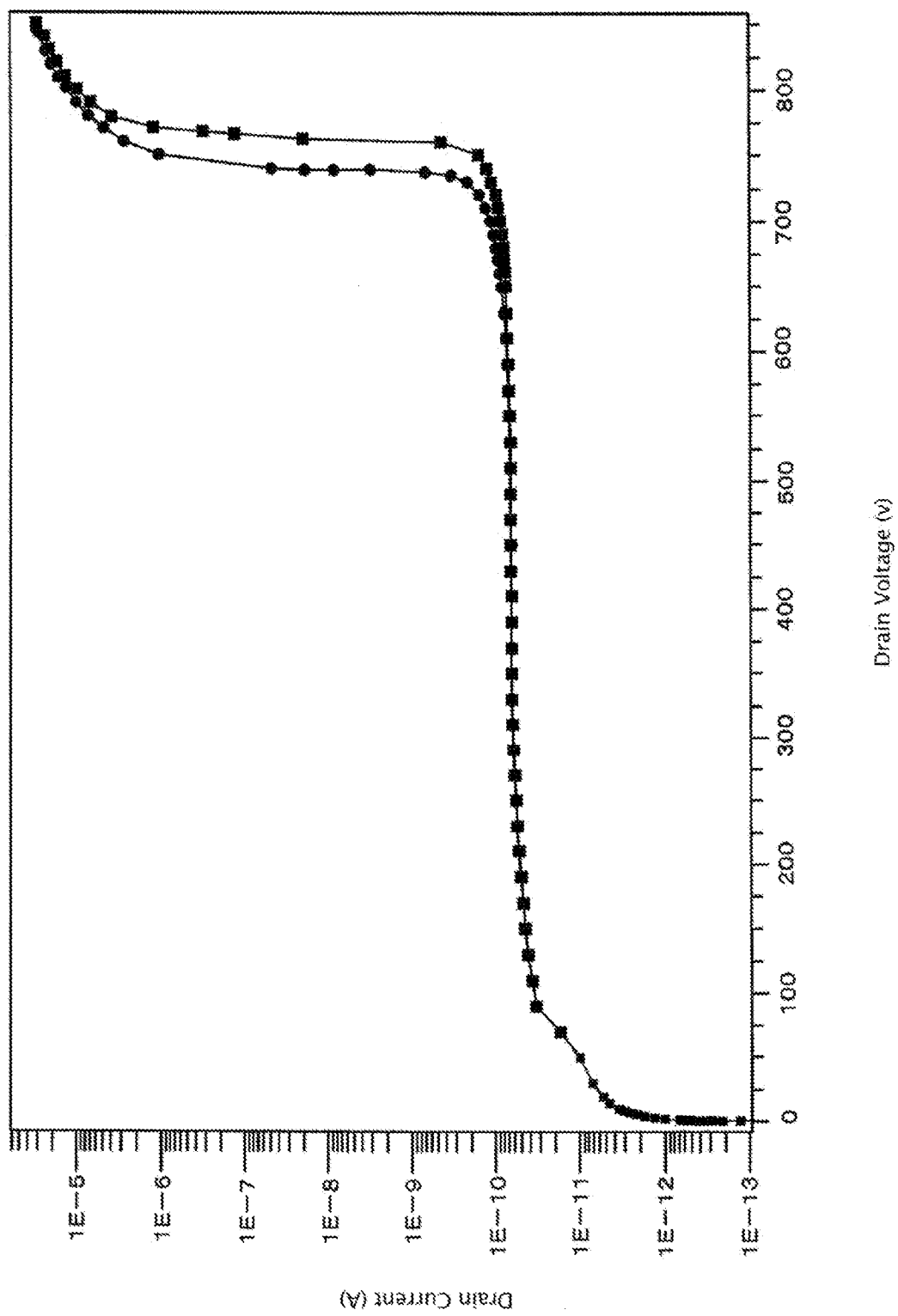
FIG. 4 is a diagram showing breakdown voltage simulation results.

FIG. 4, being a diagram showing breakdown voltage simulation results, shows comparative results of carrying out the breakdown voltage simulations of the high breakdown voltage semiconductor devices 500 and 600 with the structure of the n-type buffer layer 612 depicted in FIG. 5, and the structure of the n-type buffer layer 112 shown in FIG. 1. In the simulations, a drain voltage at which a drain current (Ids) becomes 100 nA when the support substrate 100, source electrode 108, and gate electrode 110 of the high breakdown voltage semiconductor devices 500 and 600 are fixed at the ground potential, and a positive bias is applied to the drain electrode 109, is the voltage at which the breakdown condition occurs. However, the film thickness of the dielectric layer 101, the film thickness and resistivity of the n− type semiconductor layer 102, and the impurity concentration profile of the p-type well diffusion layer 111, drain n+ layer 113, source n+ layer 114, and well pick-up p+ layer 115, of the high breakdown voltage semiconductor devices 500 and 600 are the same.

As opposed to the breakdown voltage of BVds=740V (W=25 μm, Ids=100 nA) with the configuration of the reference example of FIG. 5, with the configuration of the invention of FIG. 1, it is possible to increase the breakdown voltage by 25V to BVds=765V (W=25 μm, Ids=100 nA) (W is the high breakdown voltage semiconductor device 500 gate channel width (μm), and Ids is the drain source current).

This is the equivalent of, when taking the breakdown voltage Vbr to be Vbr=740V and 765V respectively, and substituting d=20 μm, Tox=5 μm, $\in_{si}$=11.7, and $\in_{ox}$=3.9 in the previously described Poisson Expression 1, the critical electric field being 2.96E5 (V/cm) with the heretofore known configuration, and 3.06E5 (V/cm) with the configuration of the invention of FIG. 1. Due to the difference in the critical electric fields, it is difficult for the breakdown mode to occur with the configuration of the invention of FIG. 1, so it is possible to increase the breakdown voltage.

Also, on looking at the one dimensional electric field intensity graph of the reference example of FIG. 6B, it can be understood that the high electric field region is the bulk surface (the n⁻ type semiconductor layer 102 surface) directly below the drain electrode. This fact, there being more likely to be a surface charge effect in the reduced impurity concentration drain-drift region 602, increases the likelihood of triggering the problem of breakdown voltage fluctuation.

Furthermore, when the n-type buffer layer 612 is formed in the heretofore known circular shape, as in the high breakdown voltage semiconductor device 600, a high electric field region builds up at a greater portion of the interface of the dielectric layer 101 and n⁻ type semiconductor layer 102, in addition to the surface electric field, as can be understood from the one dimensional electric field intensity graph of the reference example of FIG. 6B, meaning that the amount of hot carrier occurring in the high electric field region when a high pressure is applied to the drain electrode also increases. For this reason, with the high breakdown voltage semiconductor device 600, with regard to a source drain breakdown voltage in a turned on condition in which a gate voltage is added, the electric field balance breaks down due to the occurrence of a hot carrier, and a temporal change in which the breakdown voltage decreases is likely to happen.

Therefore, from the standpoint of high reliability too, the invention, which causes an electric field concentration at the interface of the dielectric layer 101 and n⁻ type semiconductor layer 102 including the n-type buffer layer formed in a ring, reducing the surface electric field, and furthermore, as the area of the high electric field region decreases, the amount of hot carrier occurring also being kept to a minimum, the invention can be said to be extremely advantageous with regards to reliability.

Hereafter, an example of an application of the high breakdown voltage semiconductor device of the invention will be given.

Figure 9A:
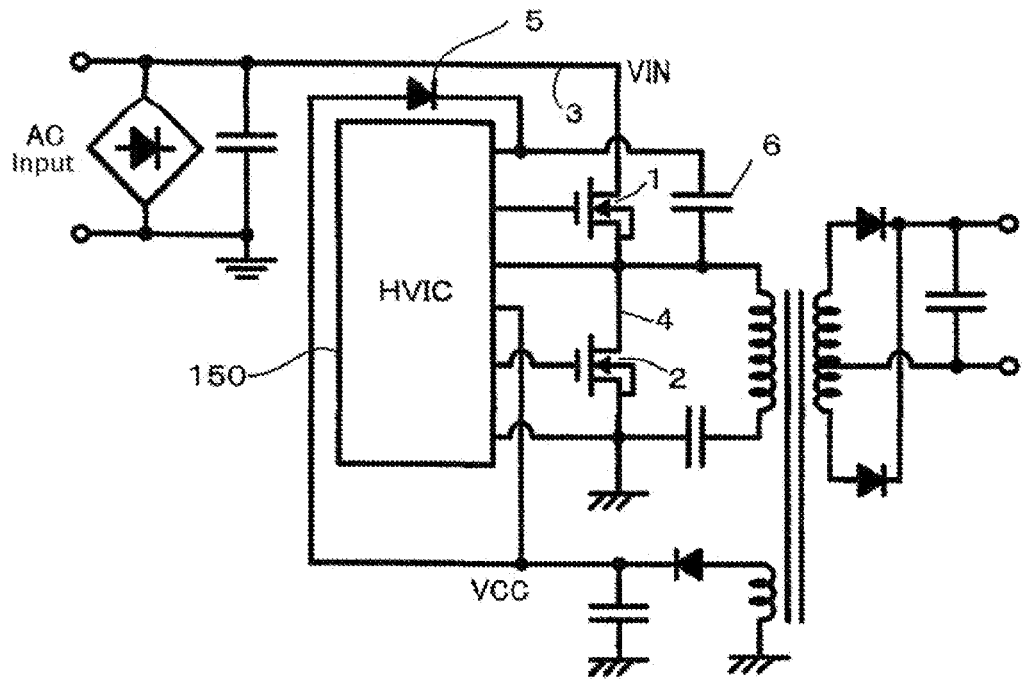
FIGS. 9A and 9B are circuit diagrams using the high breakdown voltage semiconductor device of the invention.
Figure 9B:
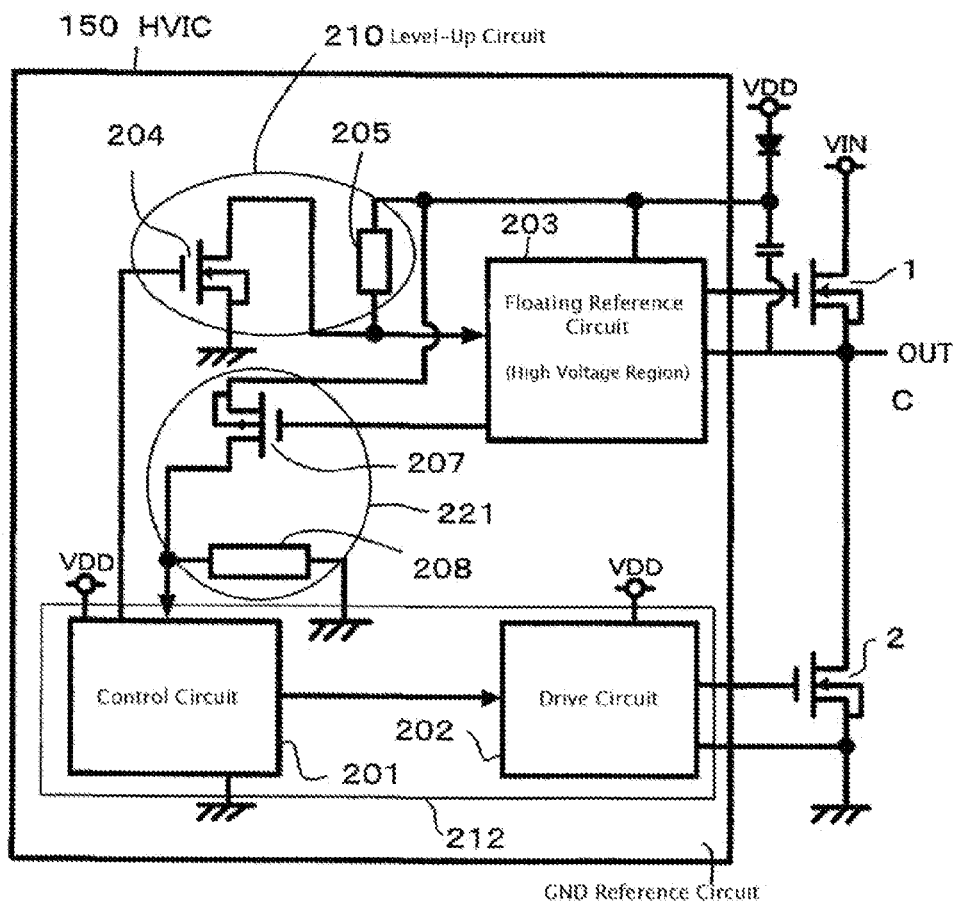

FIGS. 9A and 9B are circuit diagrams using the high breakdown voltage semiconductor device of the invention. FIG. 9A is a circuit configuration diagram showing a resonance type half bridge power source, and FIG. 9B is a block diagram showing an internal configuration of an HVIC in FIG. 9A. The heretofore known resonance type half bridge power source including the HVIC 150, output terminals of the HVIC 150 are connected to MOSFETs 1 and 2 by a wire distribution, or the like, as shown in FIG. 9A. Then, the HVIC 150 drives the MOSFETs 1 and 2 by providing a drive signal to gates of the MOSFETs 1 and 2.

In FIG. 9A, the drain terminal of the high potential side MOSFET 1 is connected to a first wire 3. A high direct current voltage in the range of approximately 400 to 500 volts is applied to the first wire 3. Also, the source terminal of the low potential side MOSFET 2 is connected to the ground (hereafter referred to as GND). Then, the source terminal of the high potential side MOSFET 1 and the drain terminal of the low potential side MOSFET 2 are connected by a second wire 4. A bootstrap circuit is configured of a bootstrap diode 5 and capacitor 6, and forms a power source of a floating reference circuit 203 of the HVIC 150 shown in FIG. 9B.

Herein, when the potential of the high potential side of the high voltage power source is taken to be VIN, and the potential of the low potential side GND, the potential of the second wire 4 is a potential which fluctuates between GND and VIN in response to a switching of the MOSFET 1 and MOSFET 2. Consequently, in order to drive the high potential side MOSFET 1, there is a need for a floating reference circuit which drives the gate, with the potential fluctuating between GND and VIN as a reference potential. Also, there is a need for a level shifter circuit between the floating reference circuit and a control circuit inside a low potential reference circuit (GND reference circuit) with the GND level as a reference potential. For this reason, the HVIC 150, which has a built-in floating reference circuit and level shifter circuit, has been proposed.

As shown in FIG. 9B, the HVIC 150 includes a control circuit 201, a drive circuit 202, the floating reference circuit 203, a first level shifter circuit (hereafter referred to as a level-up circuit) 210, and a second level shifter circuit (hereafter referred to as a level-down circuit) 221. Also, the output terminals of the floating reference circuit 203 and drive circuit 202, which include gate drive circuits, in the HVIC 150 are electrically connected to the gate electrodes of the high potential side MOSFET 1 and low potential side MOSFET 2 respectively by a wire distribution, or the like. The control circuit 201 and drive circuit 202 are a GND reference circuit 212, which has GND as a reference potential.

The control circuit 201 generates a control signal (hereafter referred to as an on/off signal) for turning the MOSFETs 1 and 2 on and off. Also, the control circuit 201 receives an alarm signal or warning signal from the floating reference circuit 203.

The floating reference circuit 203, being a circuit which provides a drive signal to the gate terminal of the high potential side MOSFET 1 connected to the VIN side, is a circuit which has as a reference an output potential fluctuating in response to the switching of the MOSFET. That is, the floating reference circuit 203 receives a MOSFET on/off signal generated by the control circuit 201, via the level-up circuit 210, and turns the high potential side MOSFET 1 on and off in response to the received on/off signal.

Furthermore, the floating reference circuit 203 has functions such as temperature detection, overcurrent protection, and low voltage protection for the MOSFET 1, and turns the high potential side MOSFET 1 off based on these items of detection information. Also, the floating reference circuit 203 transmits an alarm signal or warning signal based on, for example, these items of detection information to the control circuit 201, via the level-down circuit 221.

The drive circuit 202 receives a MOSFET on/off signal generated by the control circuit 201, and turns the low potential side MOSFET 2 on and off in response to the received on/off signal. The level-up circuit 210 converts a MOSFET on/off signal generated by the control circuit 201 from the GND reference to a signal level of a floating reference of a potential higher than the GND, and outputs it to the floating reference circuit 203.

The level-up circuit 210 includes a high breakdown voltage NMOSFET 204 and a first level shifter resistor (first resistor) 205. The first level shifter resistor 205 is connected to the drain terminal of the high breakdown voltage NMOSFET. In the level-up circuit 210, when the gate terminal of the high breakdown voltage NMOSFET 204 is biased to a positive potential of a threshold value or higher with respect to the source terminal, the high breakdown voltage NMOSFET 204 attains a turned on condition, a current flows in the first level shifter resistor 205, and a signal voltage is generated. The signal voltage is supplied to the floating reference circuit 203 as an on/off signal converted to the signal level of the floating reference.

The level-down circuit 221 converts a floating reference signal voltage generated by the floating reference circuit 203 to a GND reference signal voltage, and outputs it to the control circuit 201. That is, the level-down circuit 221 includes a high breakdown voltage PMOSFET 207 and a second level shifter resistor (second resistor) 208 connected to the drain terminal of the high breakdown voltage PMOSFET 207. In the level-down circuit 221, when the gate terminal of the high breakdown voltage PMOSFET 207 is biased to a negative potential of a threshold value or lower with respect to the source terminal, the high breakdown voltage PMOSFET 207 attains a turned on condition, a current flows in the second level shifter resistor 208, and a signal voltage is generated. The signal voltage is supplied to the control circuit 201 as an alarm signal or warning signal converted to the signal level of the GND reference.

It is possible to apply the high breakdown voltage semiconductor device of the invention to the heretofore described high breakdown voltage NMOSFET 204 of the HVIC 150.

Figure 10:
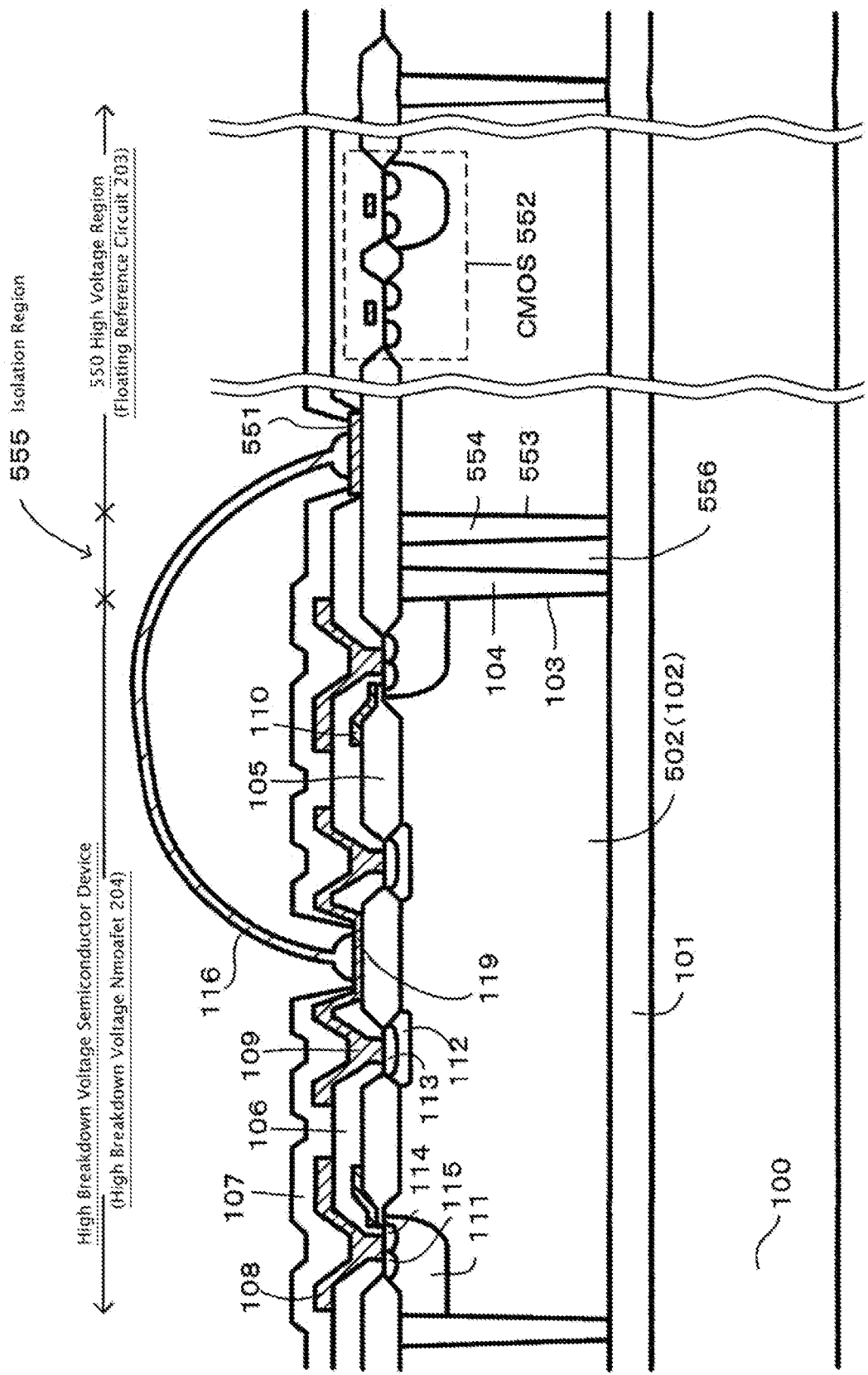
FIG. 10 is a sectional view of a main portion of a high voltage integrated circuit device of the invention.

FIG. 10, being a sectional view of a main portion of a high voltage integrated circuit device of the invention, depicts the high breakdown voltage semiconductor device 500 (the high breakdown voltage NMOSFET 204) shown in FIG. 1 and the floating reference circuit 203 (a high voltage region 550) shown in FIG. 9.

The high voltage region 550 is isolated from other regions by an insulating film 554 embedded in a trench 553, and by the dielectric layer 101. In an isolation region 555 configured of the trench 103, the trench 554, and a semiconductor region 556 between them, it is desirable that the semiconductor region 556 has a fixed potential. Also, in order to increase an isolation breakdown voltage, a configuration the same as the trench 103 and insulating film 104 may also be further formed in the semiconductor region 556 between the trench 103 and trench 554. Although not shown, the level shifter resistor 205 shown in FIG. 9B is also formed in the high voltage region 550. Also, the drain pad 119 connected to the drain electrode 109 of the high breakdown voltage semiconductor device 500, and an electrode pad 551 of the high voltage region 550, are connected by the bonding wire 116. The electrode pad 551 is connected by an unshown metal wire to a drive circuit formed in the high voltage region 550, which is configured of a CMOS 552 or the like. The output of the drive circuit provides a drive signal to the gate terminal of the high potential side MOSFET 1 depicted in FIG. 9.

Figure 11A:
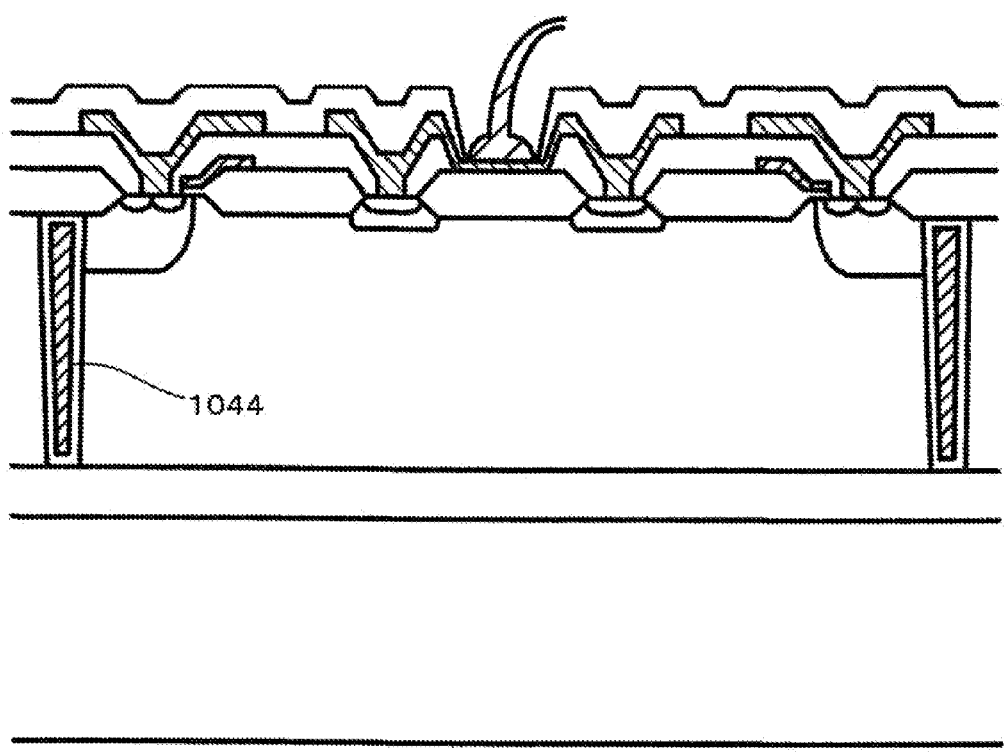
FIGS. 11A and 11B are sectional views of a main portion of the high breakdown voltage semiconductor device of the invention.
Figure 11B:
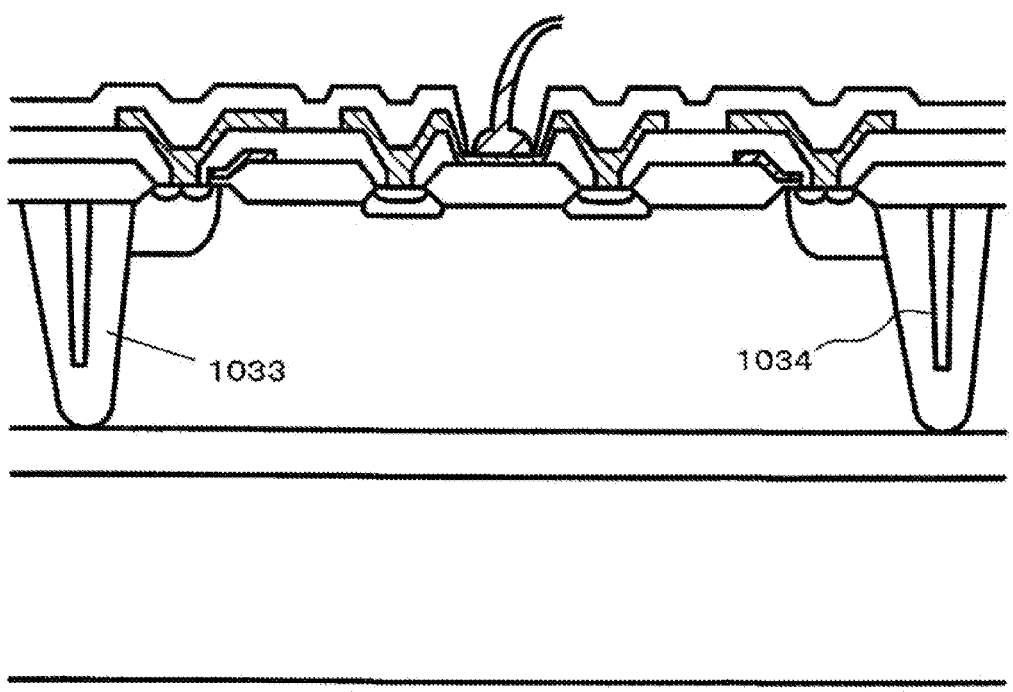
Figure 12:
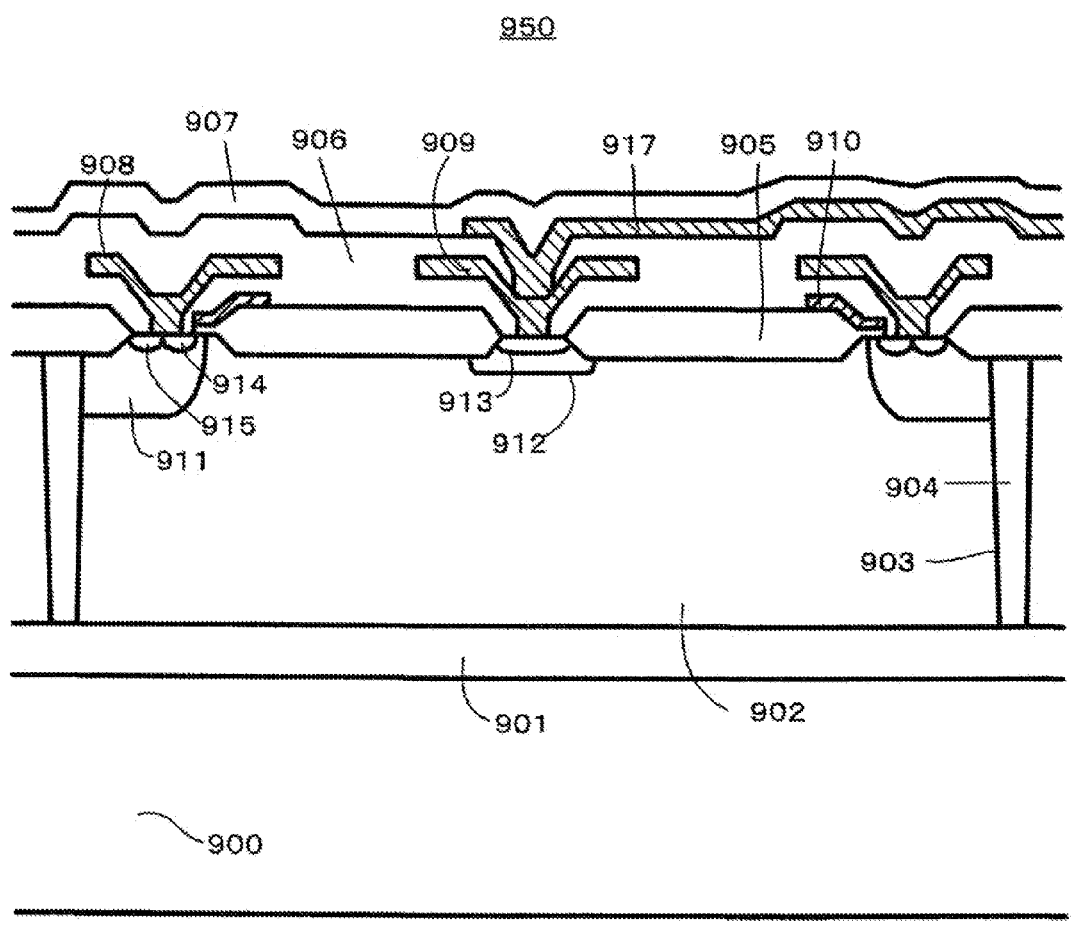
FIG. 12 is a sectional view of a main portion of a heretofore known high breakdown voltage semiconductor device.

FIGS. 11A and 11B are sectional views of a main portion of the high breakdown voltage semiconductor device of the invention.

In FIG. 11A, polysilicon 1044 is additionally embedded on an interior side of the insulating film 104 in the trench 103 of FIG. 1. In FIG. 11B, a trench 1034 is formed instead of the trench 103 of FIG. 1, impurity ions are implanted into the trench, and a diffusion region 1033 is formed by diffusing the impurities.

It is possible to obtain the advantage of the invention with these kinds of structure too.

Embodiment 2

Figure 7:
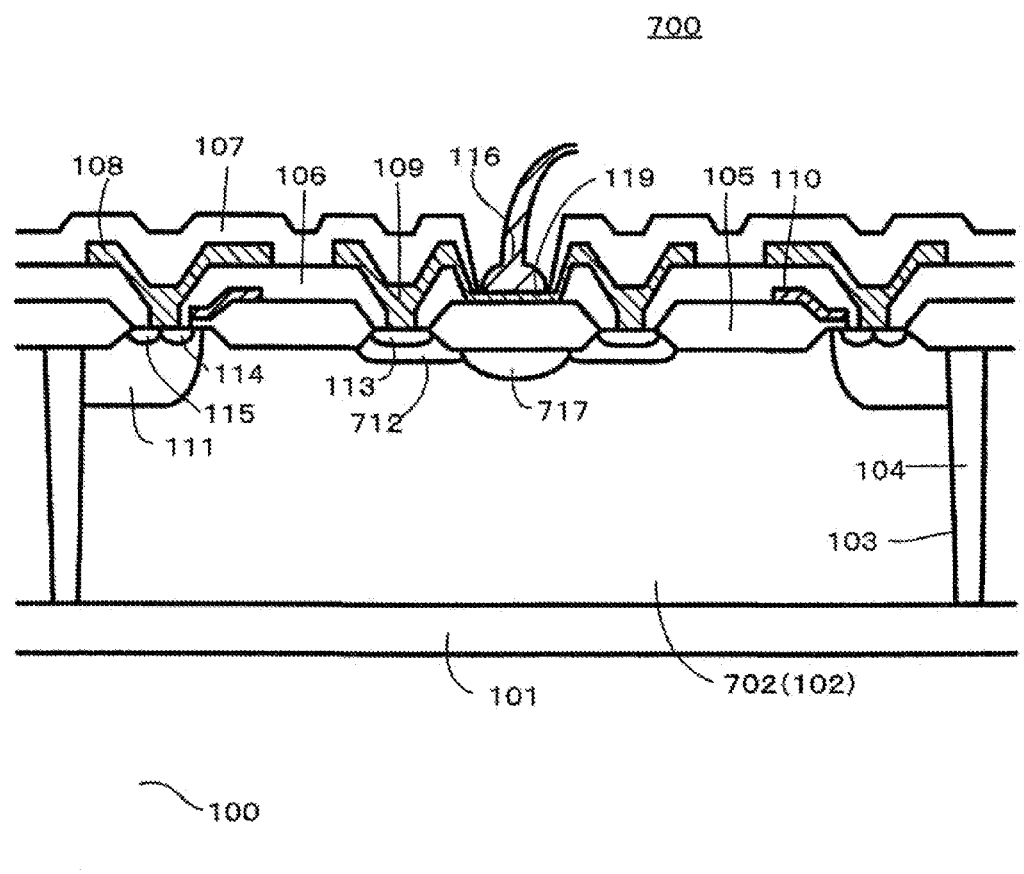
FIG. 7 is a sectional structure view of a main portion of a high breakdown voltage semiconductor device of another embodiment of the invention.

FIG. 7 is a sectional view of a main portion of a high breakdown voltage semiconductor device of another embodiment of the invention. A high breakdown voltage semiconductor device 700 is such that, a dielectric layer 101 being provided on the upper surface of a support substrate 100, an n⁻ type semiconductor layer 102, which is formed of a silicon substrate, is included on the upper surface of the dielectric layer 101. The dielectric layer 101 dielectrically isolates the support substrate 100 and n⁻ type semiconductor layer 102, and insulating isolation in a horizontal direction inside the n⁻ type semiconductor layer 102 is compartmentalized by, a trench 103 being formed in the n⁻ type semiconductor layer 102, trench dielectric isolation using a silicon dioxide film 104 packed into the trench 103.

Within a predetermined range in the compartmentalized n⁻ type semiconductor layer 102, taking the n⁻ type semiconductor layer 102 to be a drain-drift region 702, a high concentration drain n⁺ layer 113, and an n-type buffer layer 712 with a resistance higher than that of the drain n⁺ layer 113, are included in a central portion of the upper surface of the n⁻ type semiconductor layer 102. Furthermore, the n-type buffer layer 712 is formed in a circular shape in such a way as to envelop the drain n⁺ layer 113, and furthermore, a p-type offset layer 717 is formed on the concentric interior side of the n-type buffer layer 712 (they are concentric circles in this case) at a diffusion depth greater than that of the n-type buffer layer 712. By forming the n-type buffer layer 712 and p-type offset layer 717 in this way, the n-type buffer layer 712 is formed in a ring. Also, a p-type well diffusion layer 111, and a source n⁺ layer 114 and well pick-up p⁺ layer 115 inside the p-type well diffusion layer 111, are each formed so as to be separated from the n-type buffer layer 712, and to encircle the n-type buffer layer 712. Also, there being provided the source n⁺ layer 114 and p-type well diffusion layer 111, and a gate electrode 110 on the drain-drift region 702 across an insulating film, a source electrode 108 and drain electrode 109 are provided on the source n⁺ layer 114 and drain n⁺ layer 113 respectively, and the source electrode 108 and drain electrode 109 are mutually insulated by a field oxide film 105. Also, field plate electrodes are provided on the source n⁺ layer 114 and drain n⁺ layer 113 jutting toward each other on the drain-drift region 702. In the embodiment, the source electrode 108 and drain electrode 109 function as the field plate electrodes by jutting out on the drain-drift region 702. Apart from a drain pad 119, they are covered by a passivation film 107 made of a plasma silicon oxide film.

Also, the film thickness of the dielectric layer 101 being Tox=5.0 μm, the film thickness of the n⁻ type semiconductor layer 102 Tsoi=20.0 μm, and the trench width of the trench 103 (is the trench width the width of the opening?) Lt=1.5 μm, the trench 103 is formed by overetching to a trench depth of around Dt=22 μm, using dry etching, so that it reaches the dielectric layer 101. A dielectric body, such as a P-TEOS oxide film, is embedded inside the trench 103. The p-type well diffusion layer 111 is formed to a diffusion depth of around Xj=3.5 μm by a high temperature thermal oxidation and a high temperature N₂ drive-in process. The p-type offset layer 717 and n-type buffer layer 712 are formed to diffusion depths of around Xj=2.0 μm and Xj=1.3 μm respectively by a high temperature N₂ drive-in process. At this time, the p-type offset layer 717 being a configuration of a higher concentration and greater diffusion depth than that of the n-type buffer layer 712, it is important that absolutely none of the n-type buffer layer 712 remains within the region in which the p-type offset layer 717 diffuses.

Also, the resistivity of the n⁻ type semiconductor layer 102 is 12.5 (Ω/cm), the boron impurity concentration of the p-type well diffusion layer 111 is around 1.5E17 (/cm³), the boron impurity concentration of the p-type offset layer 717 is around 2E17 (/cm³), and the phosphorus impurity concentration of the n-type buffer layer 712 is around 1E17 (/cm³). The source n⁺ layer 114 and drain n⁺ layer 113 are formed with an arsenic impurity concentration of 1E20 (/cm³), and the well pick-up p⁺ layer 115 with a BF₂ impurity concentration of 1E20 (/cm³). The distance between the n-type buffer layer 712 and p-type well diffusion layer 111 is approximately 100

μm, and the width (diameter) of the drain pad 119, which is for a bonding electrically connected to the drain electrode 109, is around 100 μm.

Furthermore, a high potential wiring from the high breakdown voltage semiconductor device 700 to a high potential floating region is carried out with a bonding wire 116 connected by bonding to the drain pad 119.

According to the heretofore described configuration, an increase in breakdown voltage and an increase in reliability are achieved, as with Embodiment 1.

Embodiment 3

Figure 8:
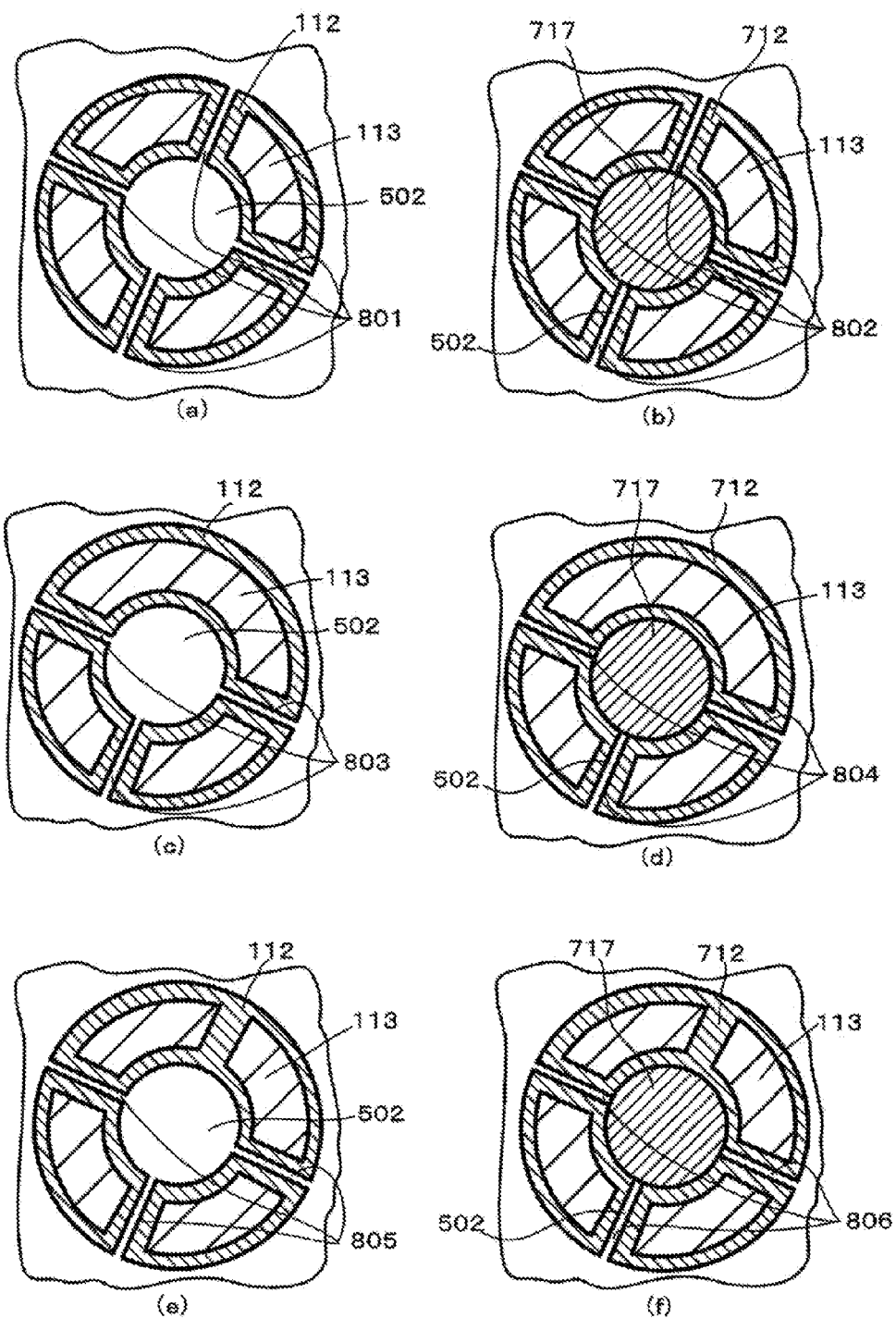
FIGS. 8A to 8F are plan views of a main portion of a high breakdown voltage semiconductor device of another embodiment of the invention.

FIGS. 8A to 8F being plan views of a main portion of a high breakdown voltage semiconductor device of another embodiment of the invention, FIGS. 8A, 8C, and 8E are modification examples of the drain n$^+$ layer 113 and n-type buffer layer 112 in FIG. 1, while FIGS. 8B, 8D, and 8F are modification examples of the drain n$^+$ layer 113 and n-type buffer layer 712 in FIG. 7.

In FIG. 8A, the n-type buffer layer 112, being configured of four fan-shaped regions isolated by slits 801, as a whole forms a non-continuous ring. In FIG. 8B too, in the same way, the n-type buffer layer 712, being configured of four fan-shaped regions isolated by slits 802, as a whole forms a non-continuous ring.

In FIGS. 8C and 8E, the n-type buffer layer 112, being configured of one semi-circular region and two fan-shaped regions isolated by slits 803 and 805, as a whole forms a non-continuous ring. In FIGS. 8D and 8F too, in the same way, the n-type buffer layer 712, being configured of one semi-circular region and two fan-shaped regions isolated by slits 804 and 806, as a whole forms a non-continuous ring.

In FIGS. 8C and 8D, a drain n$^+$ layer 113 is formed in each of the n-type buffer layer 112 and n-type buffer layer 712 configured of three regions, while in FIGS. 8E and 8F, a drain n$^+$ layer 113 configured of two regions is formed in the semicircular area of the n-type buffer layer 112 and n-type buffer layer 712.

The slits may also be formed in a fan shape or semicircular shape when forming the buffer layers 112 and 712, so that an n$^-$ type semiconductor layer 102 is exposed on the surface, and they may also be formed by forming a p-type diffusion layer from the surface of the n$^-$ type semiconductor layer 102 after forming the buffer layers 112 and 712 in a ring.

In each diagram, the drain n$^+$ layer 113 forms a non-continuous ring due to having slits.

As depicted in FIGS. 8A to 8F, by providing the slits in the n-type buffer layers 112 and 712, it is possible to further reduce the area of the electric field concentration region in comparison with Embodiments 1 and 2. As shown in FIGS. 3A, 3B, 6A and 6B, an electric field concentrates at the interface of the n$^-$ type semiconductor layer 102 and dielectric layer 101 when a high potential is applied to the drain electrode, but by dividing the n-type buffer layers 112 and 712 into slit forms, the electric field concentration region too concentrates only at the interface of the n$^-$ type semiconductor layer 102 and dielectric layer 101 under the position of the n-type buffer layers 112 and 712, and it is possible to divide the high electric field region. Therefore, it being difficult for an avalanche breakdown to occur, it is possible to increase breakdown voltage.

The width of the slits 801 to 806 being determined in accordance with a predetermined on-state current of the high breakdown voltage semiconductor devices 500 and 700, they are of a configuration that does not affect an on-resistance in the event that they are at intervals in the range of around 10 μm. As they cause an increase in drift resistance or a reduction in an amount of ESD breakdown in the event that they are too widely-spaced, intervals in the range of 5 μm to 10 μm are preferable.

In the heretofore described embodiments, a description has been given of a MOSFET as the high breakdown voltage semiconductor device, but the invention can also be applied to a diode. In the case of applying the invention to a diode, it is possible to increase the off-state breakdown voltage. With an HVIC, it is advantageous to apply the invention to a case in which the bootstrap diode 5 shown in FIGS. 9A and 9B is integrated in the HVIC 150. As a configuration, a configuration wherein the heretofore shown high breakdown voltage semiconductor devices are modified is sufficient. For example, in the case of the high breakdown voltage semiconductor device 500, it is sufficient to adopt a configuration wherein the source n$^+$ layer 114 is changed to an anode p$^+$ layer, and the gate electrode 110 is short circuited with the anode p$^+$ layer. The drain n$^+$ layer 113 becomes a cathode layer. In this case, the p-type well diffusion layer 111, well pick-up p$^+$ layer 115, and gate electrode 110 need not be formed.

The invention has been described with reference to certain preferred embodiments thereof. It will be understood that modifications and variations are possible within the scope of the appended claims.

What is claimed is:

1. A high breakdown voltage semiconductor device, comprising:
   a support substrate;
   a first conductive type semiconductor layer formed on the support substrate across a dielectric layer;
   a first conductive type drain layer, with an impurity concentration higher than that of the semiconductor layer, on the semiconductor layer;
   a first conductive type buffer layer, formed on the surface of the semiconductor layer so as to envelop the drain layer, and with an impurity concentration between those of the semiconductor layer and drain layer;
   a first conductive type source layer with an impurity concentration higher than that of the semiconductor layer, separated from the drain layer, and formed so as to surround a periphery thereof;
   a second conductive type well layer formed so as to envelop the source layer;
   a gate electrode formed on the source layer, the second conductive type well layer, and the semiconductor layer and interposed between the well layer and buffer layer, across a gate insulating film;
   a drain electrode electrically connected to the drain layer; and
   a source electrode electrically connected to the source layer,
   wherein the planar shape of the drain layer and buffer layer is a continuous ring or a non-continuous ring comprising slits between portions of the buffer layer.

2. The high breakdown voltage semiconductor device according to claim 1
   wherein the high breakdown voltage semiconductor device includes a second conductive type diffusion layer formed on the interior side of the ring at a depth from the surface of the semiconductor layer greater than that of the buffer layer.

3. The high breakdown voltage semiconductor device according to claim 1, further comprising a drain pad electrically connected to the drain electrode, across an insulating film, on the semiconductor layer on the interior side of the drain layer, and has a bonding wire connected to the drain pad.

4. The high breakdown voltage semiconductor device according to claim 2, further comprising a drain pad electrically connected to the drain electrode, across an insulating film, on the semiconductor layer on the interior side of the drain layer, and has a bonding wire connected to the drain pad.

5. The high breakdown voltage semiconductor device according to claim 1, wherein the planar shape of the drain layer and buffer layer is a non-continuous ring comprising slits between portions of the buffer layer.

6. The high breakdown voltage semiconductor device according to claim 1, wherein the planar shape of the drain layer and buffer layer is a continuous ring.

7. The high breakdown voltage semiconductor device according to claim 5, wherein the buffer layer is configured as four fan-shaped regions isolated by slits to form a non-continuous ring.

8. The high breakdown voltage semiconductor device according to claim 5, wherein the buffer layer is configured as one semi-circular region and two fan-shaped regions isolated by slits to form a non-continuous ring.

9. The high breakdown voltage semiconductor device according to claim 8, wherein the drain layer is formed as three discontinuous regions.

10. The high breakdown voltage semiconductor device according to claim 8, wherein the drain layer is formed as four discontinuous regions.

* * * * *